(12) United States Patent
Tseng et al.

(10) Patent No.: US 11,901,190 B2
(45) Date of Patent: Feb. 13, 2024

(54) METHOD OF PATTERNING

(71) Applicant: TAIWAN SEMICONDUCTOR MANUFACTURING CO., LTD., Hsinchu (TW)

(72) Inventors: Chin-Yuan Tseng, Hsinchu (TW); Yu-Tien Shen, Tainan (TW); Wei-Liang Lin, Hsin-Chu (TW); Chih-Ming Lai, Hsinchu (TW); Kuo-Cheng Ching, Hsinchu County (TW); Shi Ning Ju, Hsinchu (TW); Li-Te Lin, Hsinchu (TW); Ru-Gun Liu, Hsinchu County (TW)

(73) Assignee: TAIWAN SEMICONDUCTOR MANUFACTURING COMPANY, LTD., Hsinhcu (TW)

( * ) Notice: Subject to any disclaimer, the term of this patent is extended or adjusted under 35 U.S.C. 154(b) by 463 days.

(21) Appl. No.: 15/967,100

(22) Filed: Apr. 30, 2018

(65) Prior Publication Data
US 2019/0164772 A1    May 30, 2019

Related U.S. Application Data

(60) Provisional application No. 62/595,365, filed on Dec. 6, 2017, provisional application No. 62/593,089, filed on Nov. 30, 2017.

(51) Int. Cl.
*H01L 21/311* (2006.01)
*H01L 21/32* (2006.01)
*H01L 23/528* (2006.01)
*H01L 21/3213* (2006.01)

(52) U.S. Cl.
CPC ........ *H01L 21/31105* (2013.01); *H01L 21/32* (2013.01); *H01L 21/32139* (2013.01); *H01L 23/528* (2013.01)

(58) Field of Classification Search
CPC ......... H01L 21/31105; H01L 21/32139; H01L 21/32; H01L 21/0207; H01L 27/0207
See application file for complete search history.

(56) References Cited

U.S. PATENT DOCUMENTS

| | | | | |
|---|---|---|---|---|
| 5,741,741 A | * | 4/1998 | Tseng ................ | H01L 21/31144 257/E21.257 |
| 6,326,300 B1 | * | 12/2001 | Liu .................... | H01L 21/31116 257/E21.248 |
| 8,039,179 B2 | * | 10/2011 | Shieh ........................ | G03F 1/36 430/30 |

(Continued)

*Primary Examiner* — Sophia T Nguyen
(74) *Attorney, Agent, or Firm* — STUDEBAKER & BRACKETT, PC

(57) ABSTRACT

A method of reducing corner rounding during patterning of a substrate to form a prescribed pattern comprising a corner includes dividing the pattern into a first pattern and a second pattern, the first pattern forming a first edge of the corner and the second pattern forming a second edge of the corner. At least a portion of the second pattern overlaps the first pattern such that the first edge intersects with the second edge to form a corner of the prescribed pattern. The method further includes forming the first pattern in a first mask layer disposed on a substrate to expose the substrate and forming the second pattern in the first mask layer to expose the substrate. The substrate exposed through the first mask layer is then etched to obtain the pattern.

19 Claims, 19 Drawing Sheets

(56) References Cited

U.S. PATENT DOCUMENTS

| | | | | |
|---|---|---|---|---|
| 8,298,943 B1* | 10/2012 | Arnold | H01L 21/76811 | 438/667 |
| 8,404,581 B2* | 3/2013 | Tsai | H01L 21/31144 | 438/637 |
| 8,486,741 B2* | 7/2013 | Montanini | H01L 21/0332 | 216/64 |
| 8,584,060 B1* | 11/2013 | Brearley | G03F 1/70 | 430/30 |
| 8,728,332 B2* | 5/2014 | Lin | H01L 21/0274 | 216/13 |
| 9,385,236 B1* | 7/2016 | Sun | H01L 29/7853 | |
| 9,412,649 B1* | 8/2016 | Yen | H01L 21/76816 | |
| 9,418,868 B1* | 8/2016 | Yen | H01L 21/0337 | |
| 9,437,415 B2* | 9/2016 | Shieh | H01L 21/3086 | |
| 9,553,088 B1* | 1/2017 | Basker | H01L 21/28008 | |
| 9,564,446 B1* | 2/2017 | Weybright | H01L 21/823431 | |
| 10,163,652 B2* | 12/2018 | Chang | H01L 21/31144 | |
| 10,396,206 B2* | 8/2019 | Jha | | |
| 2006/0189122 A1* | 8/2006 | Schroeder | H01L 21/0332 | 438/622 |
| 2008/0171291 A1* | 7/2008 | Imai | G03F 1/70 | 430/319 |
| 2012/0225388 A1* | 9/2012 | Umatate | G03F 7/70466 | 430/322 |
| 2012/0278776 A1* | 11/2012 | Lei | H01L 21/823821 | 716/111 |
| 2012/0309189 A1* | 12/2012 | Park | H01L 21/31144 | 438/643 |
| 2013/0037918 A1* | 2/2013 | Chen | H01L 21/76816 | 257/622 |
| 2013/0157461 A1* | 6/2013 | Kim | H01L 21/0337 | 438/671 |
| 2013/0203257 A1* | 8/2013 | De | G03F 1/00 | 438/703 |
| 2013/0210232 A1* | 8/2013 | De | H01L 21/845 | 438/700 |
| 2013/0295769 A1* | 11/2013 | Lin | H01L 21/0274 | 438/692 |
| 2013/0320451 A1* | 12/2013 | Liu | H01L 29/66545 | 257/368 |
| 2014/0256144 A1* | 9/2014 | Lo | H01L 21/823431 | 438/703 |
| 2014/0317581 A1* | 10/2014 | Chuang | H01L 21/0274 | 716/53 |
| 2014/0377950 A1* | 12/2014 | Kim | H01L 21/76807 | 438/666 |
| 2015/0243515 A1* | 8/2015 | Yuan | H01L 21/0274 | 438/666 |
| 2015/0255299 A1* | 9/2015 | Cantone | H01L 21/3086 | 438/702 |
| 2015/0325482 A1* | 11/2015 | Hu | H01L 21/308 | 257/401 |
| 2015/0380261 A1* | 12/2015 | Chang | H01L 21/308 | 438/690 |
| 2016/0035628 A1* | 2/2016 | Tsujita | H01L 27/0207 | 438/703 |
| 2016/0148808 A1* | 5/2016 | Kim | H01L 21/32139 | |
| 2016/0155741 A1* | 6/2016 | Yoo | H01L 27/0924 | 257/369 |
| 2016/0225635 A1* | 8/2016 | Lee | H01L 21/3086 | |
| 2016/0254195 A1* | 9/2016 | Jacob | H01L 21/823821 | 438/221 |
| 2016/0300726 A1* | 10/2016 | deVilliers | G03F 7/32 | |
| 2016/0351411 A1* | 12/2016 | Xie | H01L 21/3083 | |
| 2016/0379891 A1* | 12/2016 | Park | H01L 21/823475 | 257/401 |
| 2017/0148687 A1* | 5/2017 | Do | H01L 21/32139 | |
| 2017/0338116 A1* | 11/2017 | deVilliers | H01L 21/0332 | |
| 2017/0345913 A1* | 11/2017 | Dai | H01L 29/66795 | |
| 2018/0286859 A1* | 10/2018 | Kang | H01L 21/845 | |
| 2018/0315602 A1* | 11/2018 | Tseng | H01L 21/0338 | |
| 2019/0006345 A1* | 1/2019 | Wang | H01L 27/0207 | |
| 2019/0013245 A1* | 1/2019 | Jha | H01L 21/32139 | |
| 2019/0129307 A1* | 5/2019 | Kwon | G03F 7/11 | |
| 2019/0157135 A1* | 5/2019 | Ku | H01L 21/76232 | |
| 2019/0164772 A1* | 5/2019 | Tseng | H01L 21/32 | |
| 2019/0259600 A1* | 8/2019 | Chang | H01L 21/3065 | |

* cited by examiner

METHOD OF PATTERNING

CROSS-REFERENCE TO RELATED APPLICATIONS

This application claims priority to U.S. Provisional Patent Application No. 62/593,089 filed Nov. 30, 2017 and U.S. Provisional Application No. 62/595,365 filed Dec. 6, 2017, the entire disclosures of which are incorporated herein by reference.

TECHNICAL FIELD

This disclosure relates to methods of patterning fine structures for semiconductor manufacturing processes and in particular relates to lithography and etching operations.

BACKGROUND

The demand for computational power keeps increasing while the size of devices and processors keeps decreasing. This requires increased functional density, i.e., number of interconnected devices per chip, in semiconductor integrated circuits (ICs). As individual devices in an IC get smaller, the patterning specification gets tighter because of the smaller critical dimension.

Many circuit patterns have features with a rectangular shape having sharp corners. However, as light bends around corners because of diffraction, patterns with corners are not properly reproduced on the wafer, resulting in a distorted pattern and ultimately a malfunctioning device on the chip, or worse, a malfunctioning chip. Thus, ensuring that corners are not rounded, but rather reproduced as corners is one of the key requirements in semiconductor manufacturing. This is referred to in the art as "corner rounding fidelity."

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3C, 3E, 3G, and 3I show a plan view and FIGS. 3B, 3D, 3F, 3H, and 3J show a cross-section view along a vertical axis.

FIGS. 5A, 5C, 5E, 5G, and 5I show a plan view and FIGS. 5B, 5D, 5F, 5H, and 5J show a cross-section view along a vertical axis.

FIGS. 7A, 7C, 7E, 7G, 7I, 7K, 7M, and 7O show a plan view and FIGS. 7B, 7D, 7F, 7H, 7J, 7L, 7N, and 7P show a cross-section view along a vertical axis.

FIGS. 8A, 8C, 8E, 8G, 8I, 8K, 8M, 8O, 8Q, and 8S show a plan view and FIGS. 8B, 8D, 8F, 8H, 8J, 8L, 8N, 8P, 8R, and 8T show a cross-section view along a vertical axis.

DETAILED DESCRIPTION

Figure 1A:
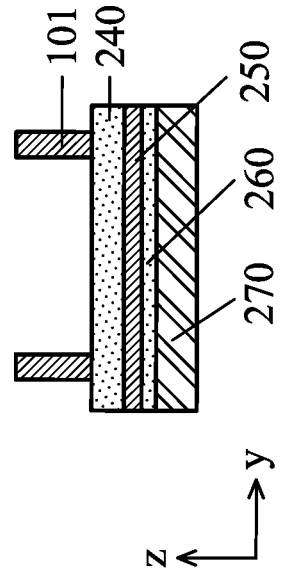
FIGS. 1A and 1B are schematic illustrations of out-corner rounding for a rectangular pattern in a plan view and a cross-section view along a vertical axis.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to patterning methods including lithography and etching operations used in semiconductor manufacturing. In particular, the presently disclosed methods relate to reducing corner-rounding during lithography of patterns with corners. Most features in semiconductor devices are designed to have sharp corners which are difficult to reproduce and maintain over various steps of semiconductor manufacturing. For example, during photolithography, corners get rounded because of diffraction effects. Likewise, during etching of materials, corners get rounded because no etchant can be perfectly anisotropic.

Figure 1B:
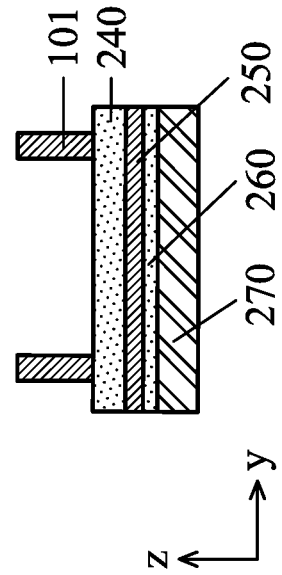

FIGS. 1A and 1B schematically illustrate out-corner rounding for a rectangular pattern. FIG. 1A shows a rectangular feature with rounded corners in a plan view, and FIG. 1B shows a cross-section along the vertical axis on the right. As can be seen in plan view in FIG. 1A, a line pattern (e.g., fin-structure) 101 shown in FIG. 1A is broadened because of out-corner rounding. An out-corner, as used herein, refers to a corner formed by edges of a pattern that are at an angle of about 90° or less.

Figure 1C:
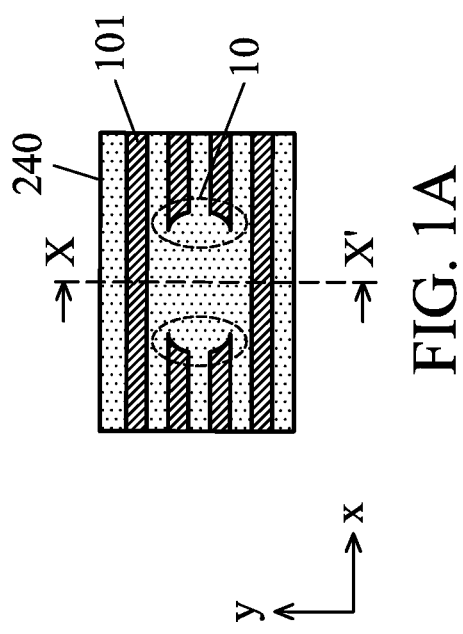
FIGS. 1C and 1D are schematic illustrations of an in-corner (marked by the oval) and an out-corner (marked by the circle) rounding for a pattern with overlapping rectangles in a plan view and a cross-section view along a vertical axis.
Figure 1D:
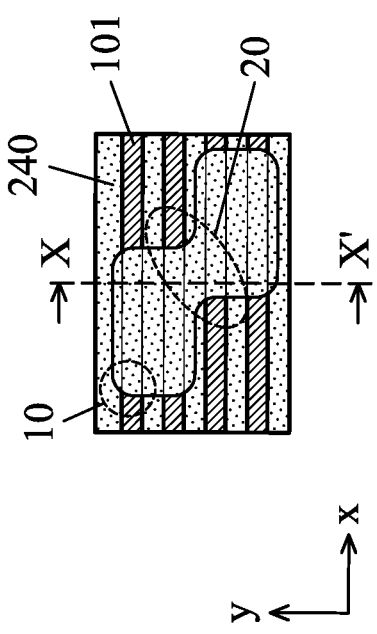

FIGS. 1C and 1D schematically illustrate out-corner and in-corner rounding for a pattern with two overlapping rectangles. FIG. 1C shows the pattern with overlapping rectangles having the rounded corners in a plan view, FIG. 1D shows a cross-section view along the vertical axis on the right. As can be seen in FIG. 1C, the line pattern 101 is broadened because of the rounding for the out-corner and narrowed for the in-corner. An in-corner, as used herein, refers to a corner formed by edges of a pattern that are at an angle of about 180° or more. In other words, features having out-corners form convex polygons while a feature with a single in-corner makes a non-convex polygon.

Thus, rounding of corners results in a variation in the critical dimension of the feature because the portions near the rounded corner are broader or wider than prescribed. Efforts are, therefore, needed to reduce occurrence of rounding in lithography and etching processes.

Figure 2:
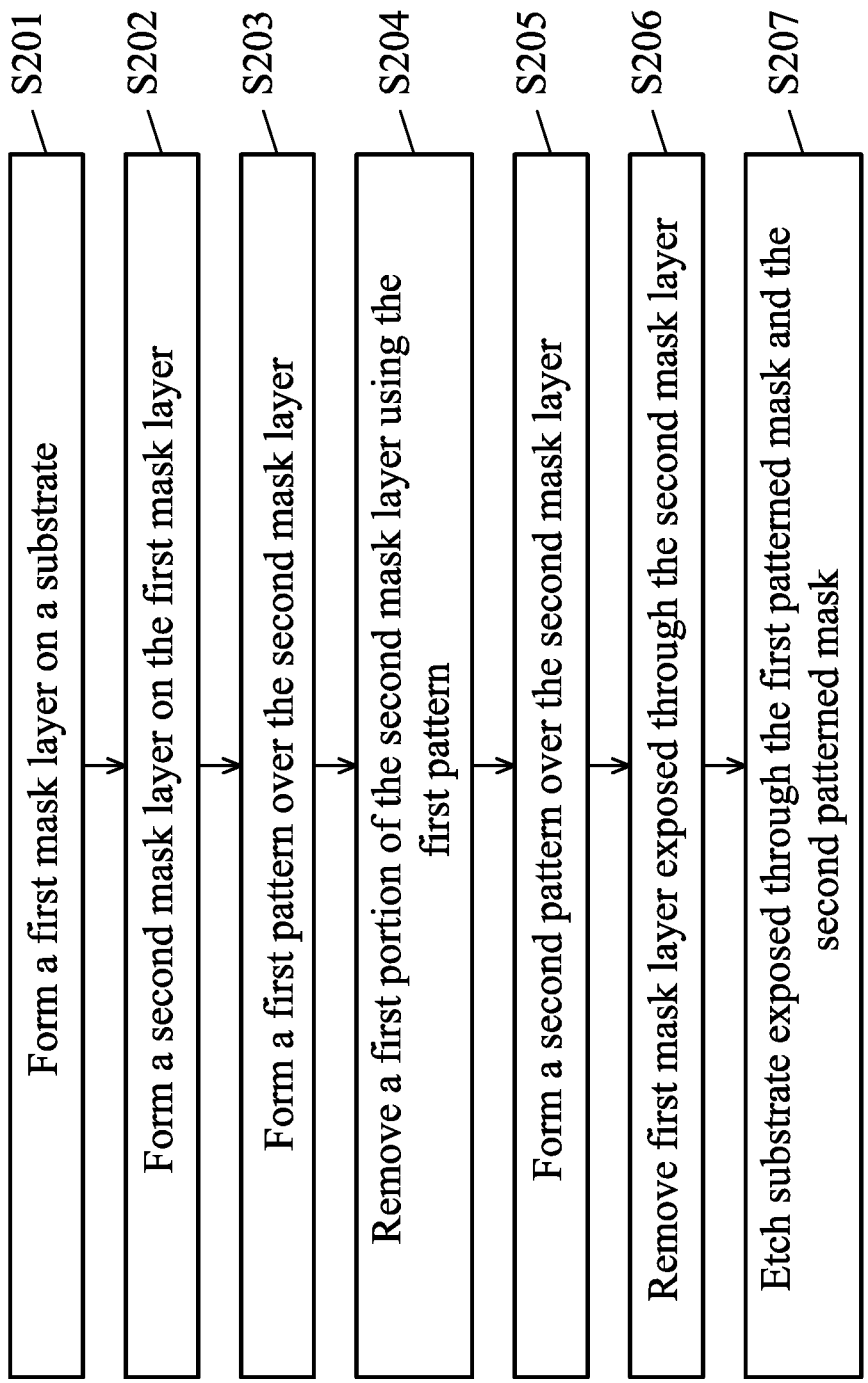
FIG. 2 illustrates a flow chart for a patterning method in accordance with the present disclosure.
Figure 3A:
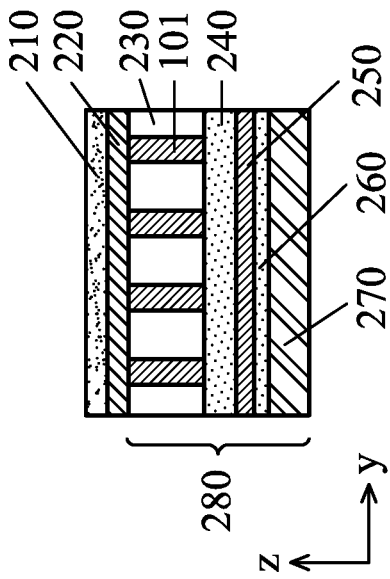
FIGS. 3A-3J schematically illustrate various stages of formation of a rectangular pattern using a patterning method in accordance with an embodiment of the present disclosure.
Figure 3B:
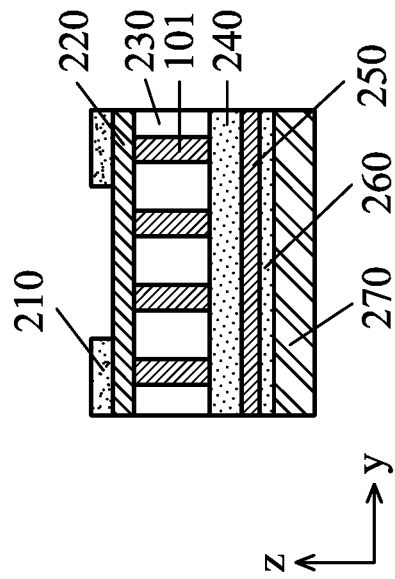

FIG. 2 illustrates a flow chart for a method of lithography in accordance with an embodiment of the present disclosure. FIGS. 3A-3J schematically illustrate the various stages of formation of a rectangular pattern using a method of lithography in accordance with an embodiment of the present disclosure. FIGS. 3A, 3C, 3E, 3G, and 3I show a plan view and FIGS. 3B, 3D, 3F, 3H, and 3J show a cross-section view along the line X-X'. The patterning method will be described below in reference to FIGS. 2 and 3A-3J. In an embodiment, the method includes, at S201, forming a first mask layer 220 over a substrate 280. The substrate 280 is a substrate to which a prescribed pattern is to be provided. In various embodiments, as illustrated in FIGS. 3A and 3B, the substrate 280 includes previously patterned line-structures such as fins, gate patterns, or metal wires 101. Thus, in various embodiments, the substrate 280 includes two or more materials, disposed in a preexisting pattern. For example, the substrate 280 includes line patterns 101 formed of silicon nitride or silicon dioxide and separated by spacer 230 formed of doped silicon in some embodiments. In other embodiments, the line patterns 101 are formed of doped silicon separated by spacer 230 formed of silicon nitride or silicon oxide or other dielectric material. In yet other embodiments, the line patterns 101 are formed of metallic material separated by a spacer 230 formed of silicon nitride and/or silicon dioxide or other dielectric material. In various embodiments, the line patterns 101 and the spacer 230 are formed on a silicon-on-insulator (SOI) substrate having a doped or undoped silicon layer 240, an oxide (or other insulator) layer 250, a silicon layer 260 and a silicon substrate 270. Those skilled in the art will appreciate that these are mere examples, and methods described herein are not restricted by the preexisting patterns and structures of the substrate 280. In other embodiments, a bulk silicon substrate is used instead of an SOI substrate. Further, in some embodiments, the layers 240, 250 and 260 are one or more of various insulating, dielectric and/or conductive layers, patterned or not patterned.

The first mask layer 220, in various embodiments, includes a hard-mask such as a silicon oxide or silicon nitride. The methods of the present disclosure are not limited by the method of depositing or forming the first mask layer 220. For example, if the first mask layer 220 is a silicon dioxide layer, it can be formed by wet or dry oxidation, CVD, spinning on a spin-on oxide, etc.

The method then moves to S202 where a second mask layer 210 is formed on the first mask layer 220. Like the first mask layer 220, the second mask layer 210 is a layer of silicon dioxide or silicon nitride in some embodiments. However, because further in the method the first mask layer 220 and the second mask layer 210 are removed or etched separately, the materials of the first mask layer 220 and the second mask layer 210 are different and exhibit etch selectivity over the other. For example, in an embodiment, if the first mask layer 220 is silicon dioxide, the second mask layer 210 is silicon nitride. In other embodiments, the first mask layer 220 is silicon nitride while the second mask layer 210 is silicon dioxide. Those skilled in the art will appreciate that the methods for forming the second mask layer 210 are only limited by process compatibility with respect to the first mask layer 220 and any preexisting structures on substrate 280. Thus, any suitable process can be used for forming the second mask layer 210.

The method then continues to S203 where a first pattern (e.g., an opening) is formed over the second mask layer 210. In various embodiments, the first pattern is a photoresist pattern formed using photolithography. For example, in an embodiment, a photoresist layer is formed on the second mask layer 210 and exposed to light through a photomask having an appropriate pattern. The photoresist is then developed so as to remove an appropriate portion of the photoresist to form the first pattern over the second mask layer 210. As discussed elsewhere herein, the etchant for the second mask layer 210 is chosen to ensure that first mask layer 220 is substantially unetched after the etching of second mask layer 210. In various embodiments, the photoresist is a positive resist or a negative resist, and the pattern of the photomask is chosen appropriately.

Figure 3C:
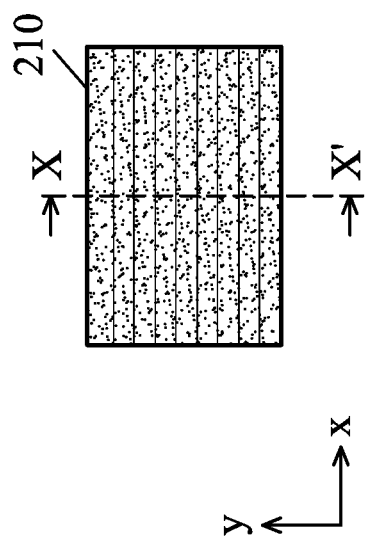
Figure 3D:
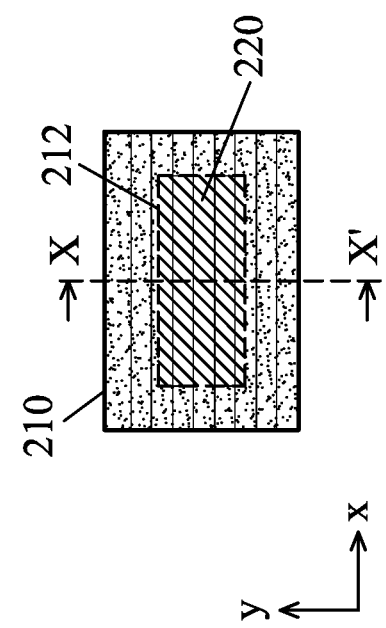

At S204, a first portion of the second mask layer 210 exposed through the first pattern 212 is removed, as shown in FIGS. 3C and 3D. The removal of the first portion of the second mask layer 210, in various embodiments, is performed by etching the second mask layer 210. Any suitable etching method can be used for etching the second mask layer 210. As discussed elsewhere herein, the etchant for the second mask layer 210 is chosen to ensure that first mask layer 220 is substantially unetched after the etching of second mask layer 210.

A second pattern is then formed over the second mask layer 210 at S205 using techniques similar to those used when forming the first pattern. The second pattern 222 is a photoresist pattern formed such that at least a portion of the first pattern overlaps the subsequently formed second pattern 222 in the first mask layer 220 so as to form the corners of the prescribed pattern. In other words, while the first pattern 212 defines the edges of the prescribed pattern along the X axis, the second pattern 222 defines the edges of the prescribed pattern along the Y axis.

Figure 3E:
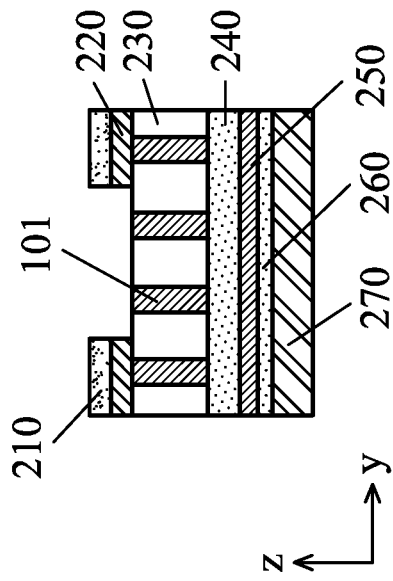

In various embodiments, the sides of the first pattern 212, as can be seen in FIG. 3E, along the Y axis are longer than the sides of the prescribed pattern along the Y axis. Thus, any rounding of the corners of the first pattern 212 is outside the area of the prescribed pattern. Likewise, the sides of the second pattern 222, as can be seen in FIG. 3E, along the X axis are longer than the sides of the prescribed pattern along the X axis. Thus, any rounding of the corners of the second pattern 222 is outside the area of the prescribed pattern.

Figure 3F:
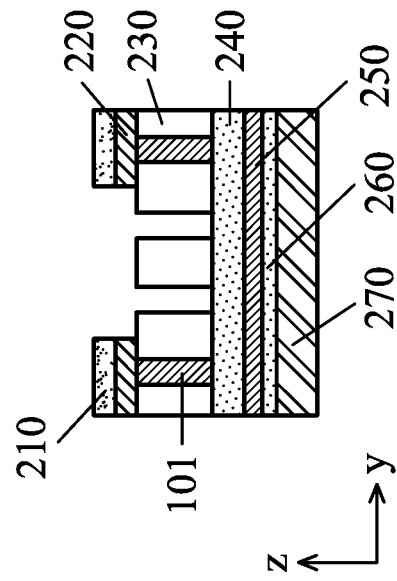
Figure 3G:
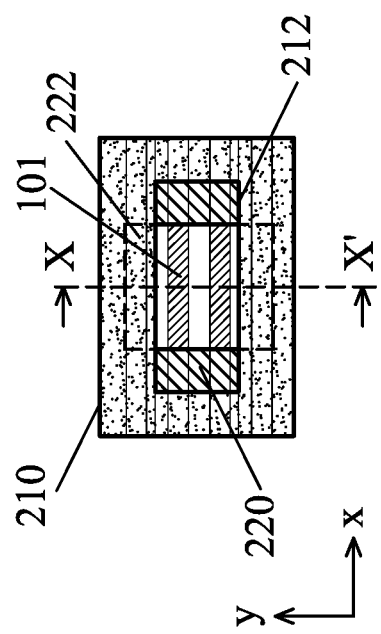
Figure 3H:
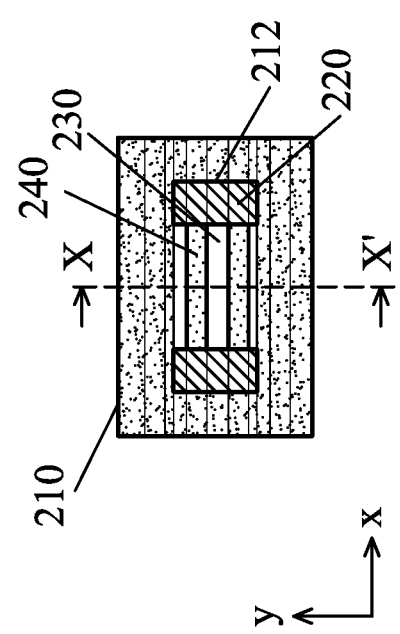
Figure 3J:
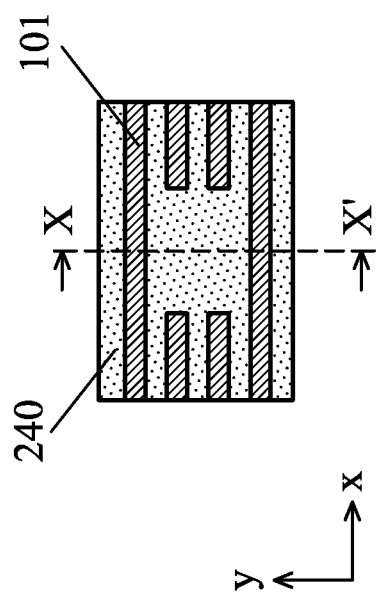
Figure 3I:
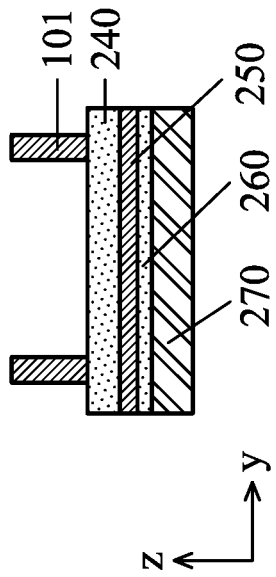

At S206, the portion of the first mask layer 220, as illustrated in FIGS. 3E and 3F, exposed through the second mask layer is removed, for example, by etching the first mask layer 220 using a suitable etchant. The method then continues to S207, where the line patterns 101 through the first mask layer 220 are then etched, as can be seen in FIGS. 3E, 3F, 3G, and 3H, with a suitable etchant to obtain the prescribed pattern. In various embodiments, etching of the substrate 280 at S207 includes several etching steps depending on the various materials in the preexisting pattern on the substrate 280. Finally, the second mask layer 210 and the first mask layer 220 are removed to reveal the prescribed pattern on the substrate 280 as illustrated in FIGS. 3I and 3J. In various embodiments, obtaining the prescribed pattern includes an additional etching step for one or more materials of the preexisting pattern on the substrate 280 after removal of the first mask layer 210 and the second mask layer 220.

Figure 4:
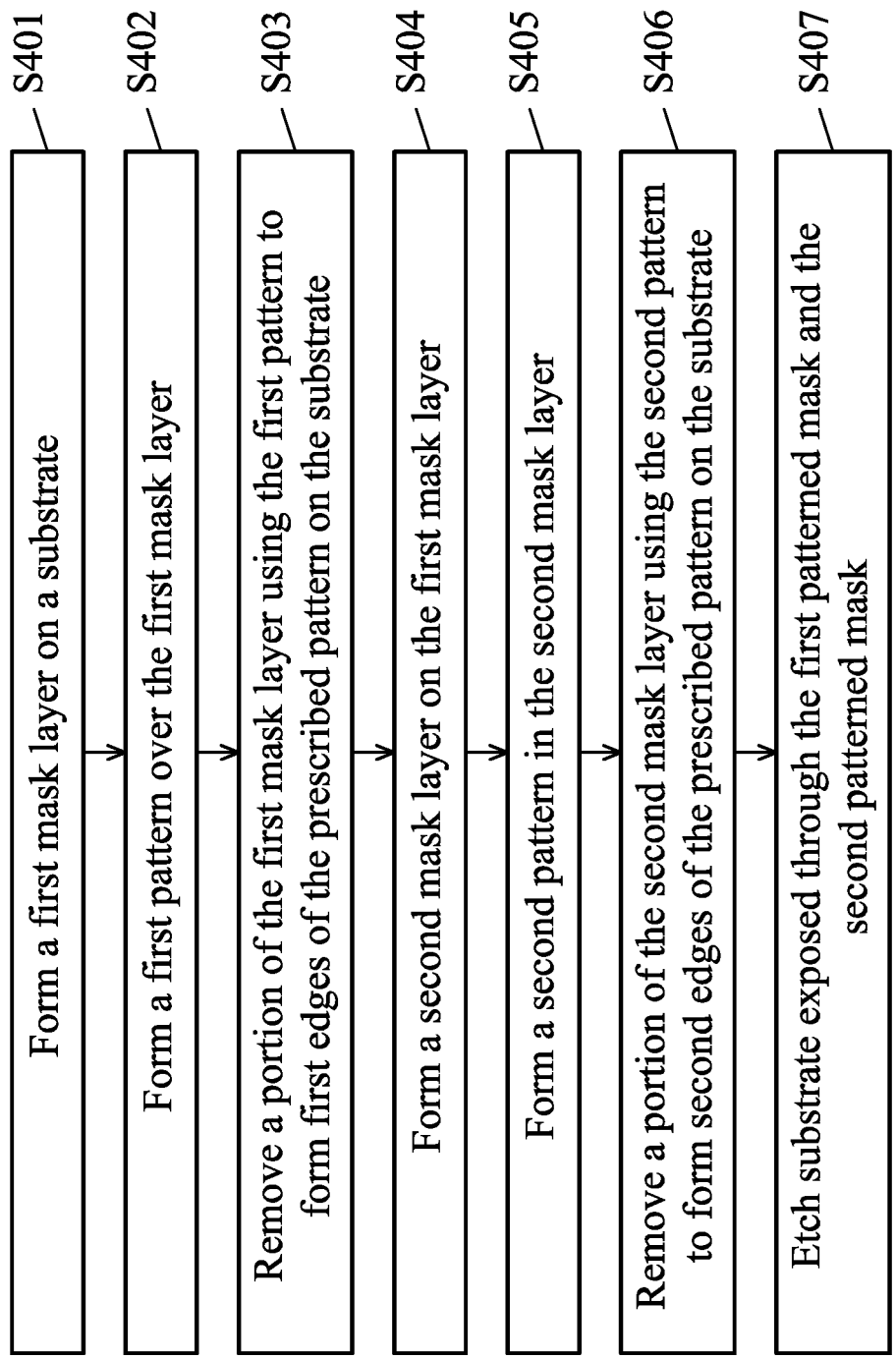
FIG. 4 illustrates a flow chart for a patterning method in accordance with the present disclosure.

FIG. 4 illustrates a flow chart for a method of lithography in accordance with another embodiment of the present disclosure. FIGS. 5A-5J schematically illustrate the various stages of formation of a rectangular pattern using a method of lithography in accordance with an embodiment of the present disclosure. FIGS. 5A, 5C, 5E, 5G, and 5I show a plan view and FIGS. 5B, 5D, 5F, 5H, and 5J show a cross-section view along line X-X'. While the materials and methods of depositing various layers may be different, where their purpose is similar, the reference numerals of structures in FIGS. 5A-5J are kept the same as in FIGS. 3A-3J for ease of understanding.

Figure 5B:
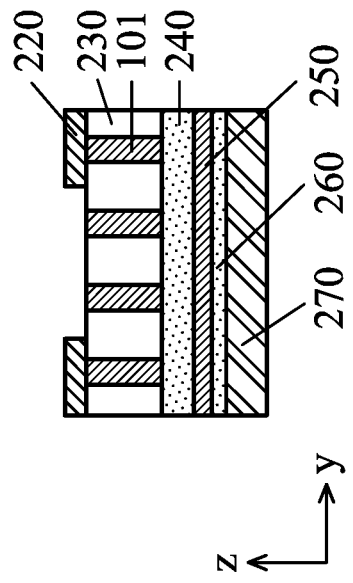
FIGS. 5A-5J schematically illustrate various stages of formation of a rectangular pattern using another patterning method in accordance with an embodiment of the present disclosure.
Figure 5D:
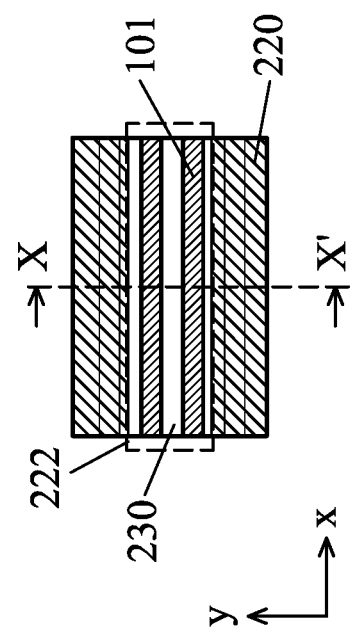
Figure 5A:
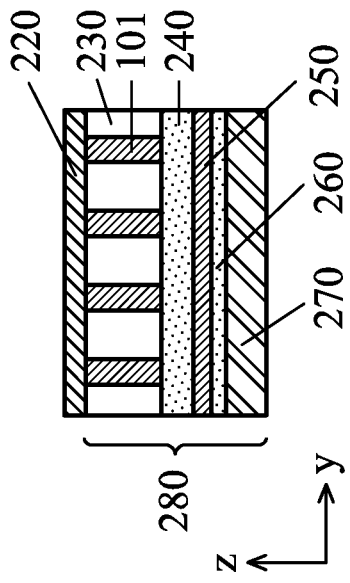

In an embodiment, the method includes, at S401, forming a first mask layer 220 on a substrate 280 as can be seen in FIGS. 5A and 5B. The first mask layer 220, in various embodiments, includes a hard-mask such as a silicon oxide or silicon nitride. The methods of the present disclosure are not limited by the method of depositing or forming the first mask layer 220. For example, if the first mask layer 220 is a silicon dioxide layer, it can be formed by wet or dry oxidation, CVD, spinning on a spin-on oxide, etc.

The method continues at S402 where a first pattern 222 is formed over the first mask layer 220. Any suitable method such as, for example, photolithography can be used for forming the first pattern. For example, in an embodiment, a photoresist layer is formed on the second mask layer 210 and exposed to light through a photomask having an appropriate pattern. The photoresist is then developed so as to remove an appropriate portion of the photoresist to form the first pattern over the first mask layer 220. In various embodiments, the photoresist is a positive resist or a negative resist, and the pattern of the photomask is chosen appropriately.

Figure 5C:
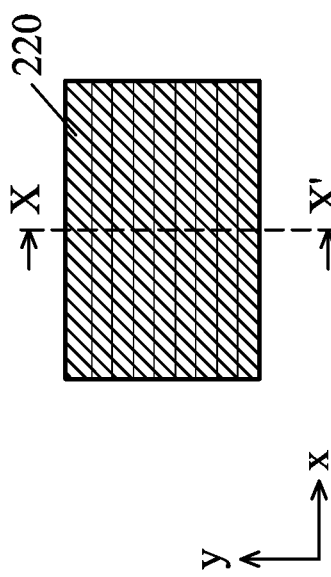

The method then moves to S403 where a first portion of the first mask layer 220 is removed using the first pattern to extend the first pattern 222 into the first mask layer and expose a portion of the substrate 280 and form the first edges of the prescribed pattern. In FIGS. 5C and 5D, the first edges are illustrated as being along the Y axis. The removal of the first portion of the first mask layer 220, in various embodiments, is performed by etching the first mask layer 220. Any suitable etching method can be used for etching the first mask layer 220 based on compatibility with the materials of substrate 280.

The method further includes, at S404, forming a second mask layer 210. Like the first mask layer 220, the second mask layer 210 is a layer of silicon dioxide or silicon nitride in some embodiments. However, because further in the method the first mask layer 220 and the second mask layer 210 are removed or etched separately, the material of the first mask layer 220 and the second mask layer 210 is different and exhibits etch selectivity over the other. For example, in an embodiment, if the first mask layer 220 is silicon dioxide, the second mask layer 210 is silicon nitride. In other embodiments, the first mask layer 220 is silicon nitride while the second mask layer 210 is silicon dioxide. Those skilled in the art will appreciate that the methods for forming the second mask layer 210 are only limited by process compatibility with respect to the first mask layer 220 and any preexisting structures on substrate 280. Thus, any suitable process can be used for forming the second mask layer 210.

Figure 5E:
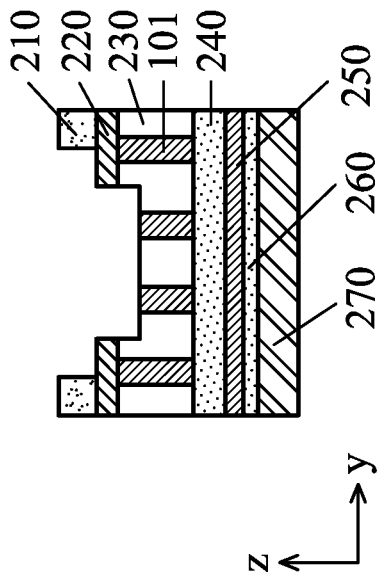
Figure 5F:
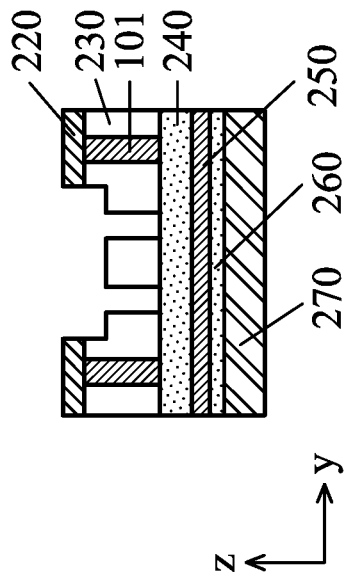
Figure 5G:
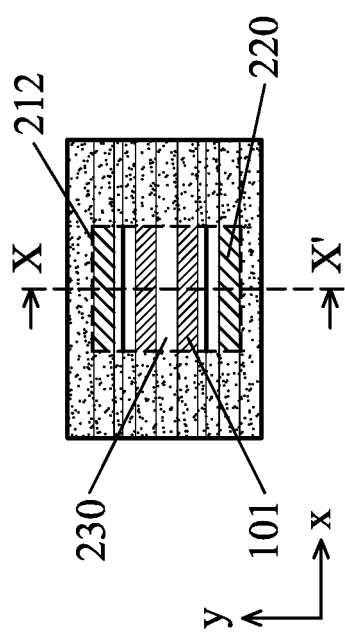
Figure 5H:
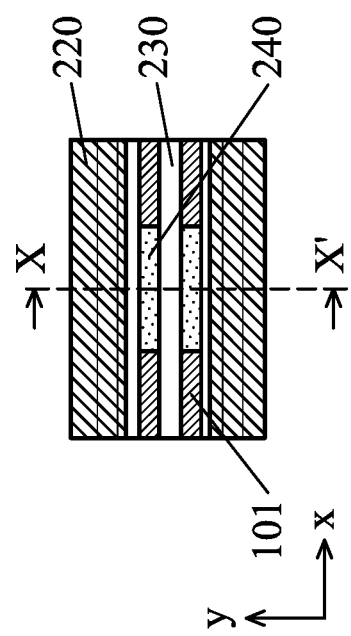
Figure 5J:
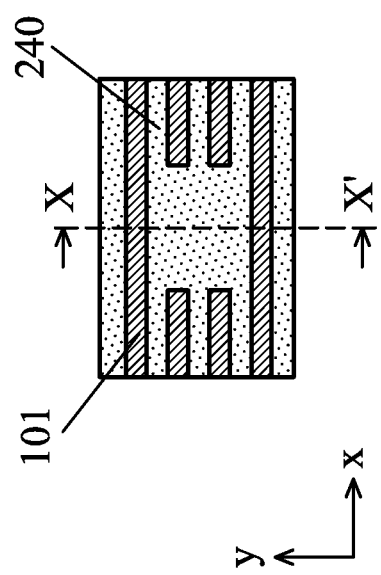
Figure 5I:
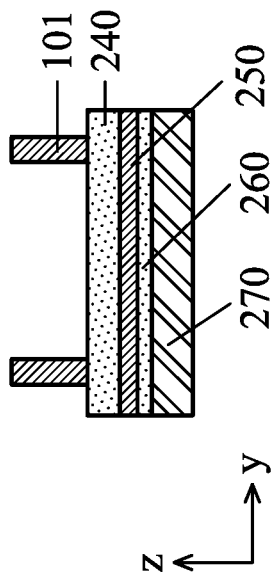

A second pattern 212, as shown in FIGS. 5E and 5F is then formed on the second mask layer 210 at S405 to define second edges of the prescribed pattern on the substrate. In an embodiment, at least portion of the second pattern 210 overlaps the first pattern 220 such that at least one of the first edges intersects with at least one of the second edges to form a first corner of the prescribed pattern. The corners of the first pattern 220 and the second pattern 210 lie outside the area of the prescribed pattern, and thus any rounding of the corners during lithography or etching is outside the area of the prescribed pattern.

The method then moves to S406 where a portion of the second mask layer 210 is removed using the second pattern 212 to form the second edges of the prescribed pattern. Suitable etching or layer removal processes can be used depending on the material of the second mask layer 210. Following the removal of the appropriate portion of the second mask layer 210, appropriate materials of the substrate 280 are then etched at S407 to form the prescribed pattern on the substrate 280 as shown in FIGS. 5D and 5E.

Thus, by selecting appropriate shapes for the first pattern and the second pattern, and appropriate ordering of forming and removing the first mask layer and the second mask layer out-corner rounding within a prescribed pattern on a substrate can be prevented in accordance with the embodiments of the present disclosure. Similarly, in-corner rounding can be prevented by varying the shapes and overlapping of the first pattern and second pattern, or adding additional mask layers and patterns and stitching together the patterns to form the prescribed pattern on the substrate.

In an embodiment, a given prescribed pattern is divided among a number of overlapping patterns, each defining an edge of the prescribed pattern. The patterns are selected such that the overlapping portions form corners of the prescribed pattern, and the corners of the patterns lie outside the area of the prescribed pattern. For example, in some embodiments, the prescribed pattern includes out-corners that have an angle of about 90° or about 270°. In such embodiments, the first edges and the overlapping portions of the patterns include edges that are orthogonal to each other.

Figure 6:
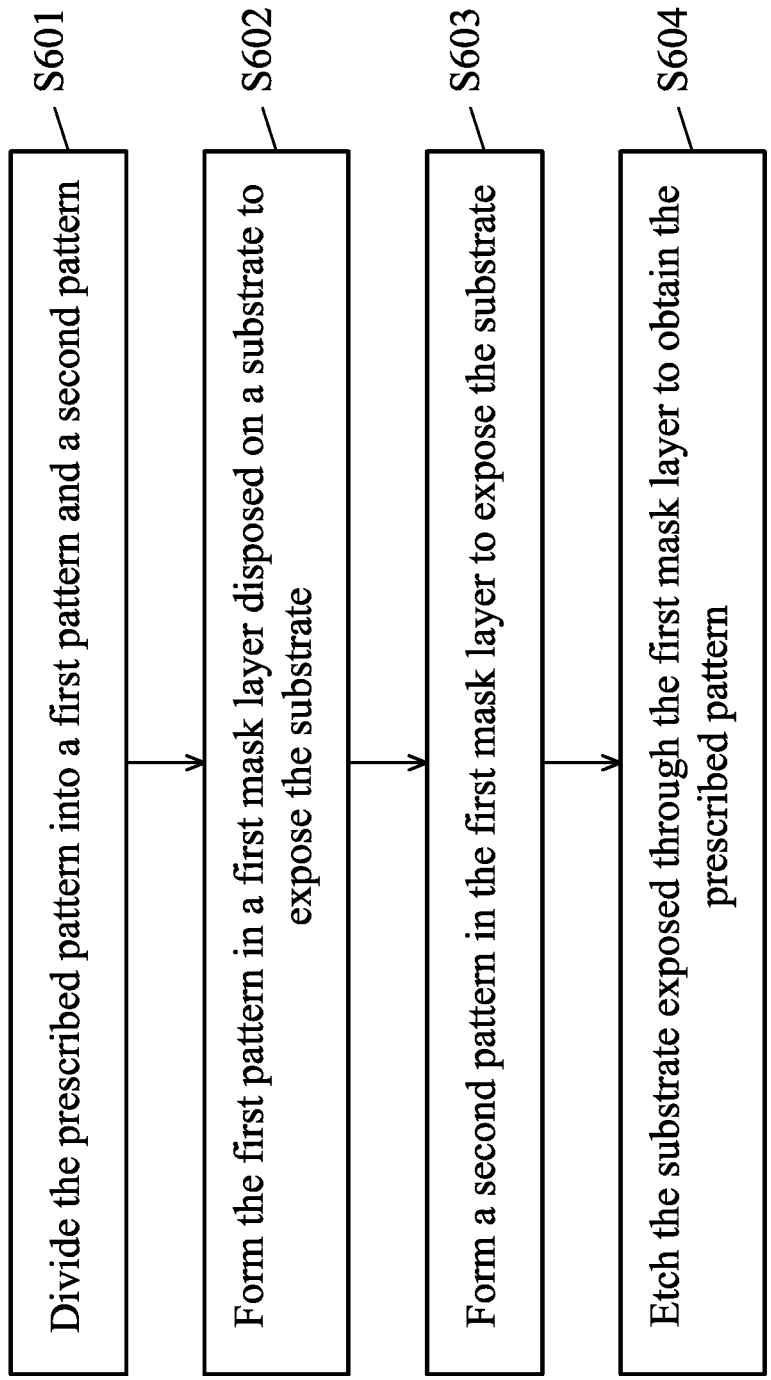
FIG. 6 illustrates a flow chart for a patterning method in accordance with the present disclosure.

FIG. 6 illustrates a flow chart for a method of reducing corner rounding during lithography of a prescribed pattern including a corner in accordance with an embodiment of the present disclosure. FIGS. 7A-7P and 8A-8T schematically illustrate the various stages of formation of a pattern having overlapping rectangles forming out-corners and in-corners, using a method of reducing corner rounding in accordance with various embodiments of the present disclosure.

In an embodiment, the method includes, at S601, dividing the prescribed pattern into a first pattern and a second pattern. The first pattern defines a first edge of a corner, and the second pattern defines a second edge of the corner. At least one portion of the second pattern overlaps the first pattern such that the first edge intersects with the second edge to form a first corner of the prescribed pattern. The method further includes, at S602, forming the first pattern in a first mask layer disposed on a substrate to expose the substrate, and at S603 forming the second pattern in the first mask layer to expose the substrate. The substrate exposed through the first mask layer is then etched at S604 to obtain the prescribed pattern.

Figure 7A:
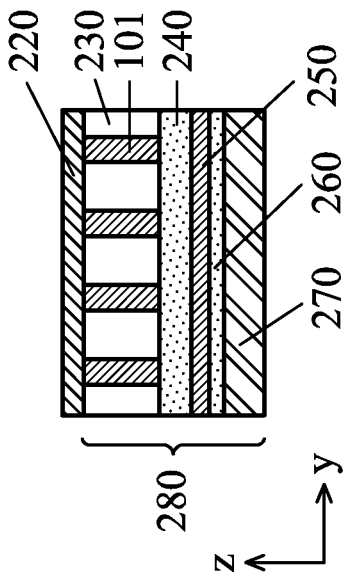
FIGS. 7A-7P schematically illustrate various stages of formation of a pattern with overlapping rectangles using a patterning method in accordance with an embodiment of the present disclosure.
Figure 7B:
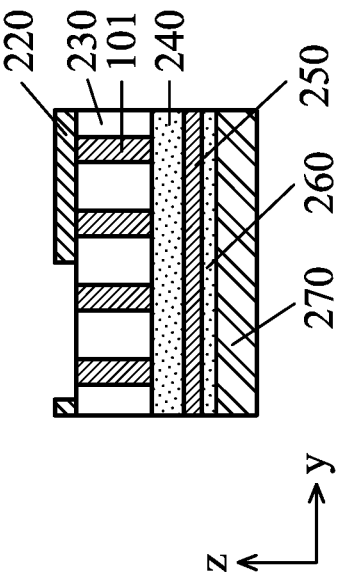
Figure 7C:
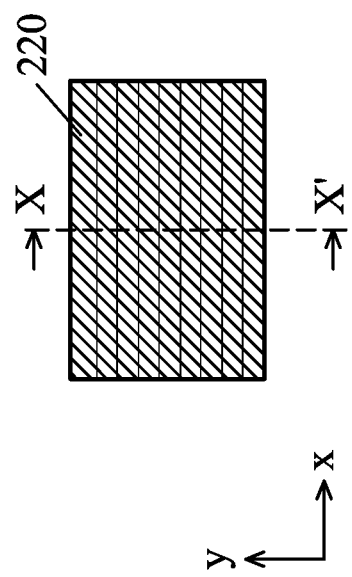
Figure 7D:
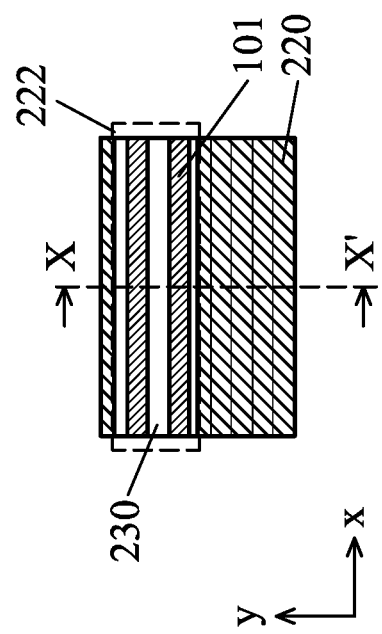
Figure 7E:
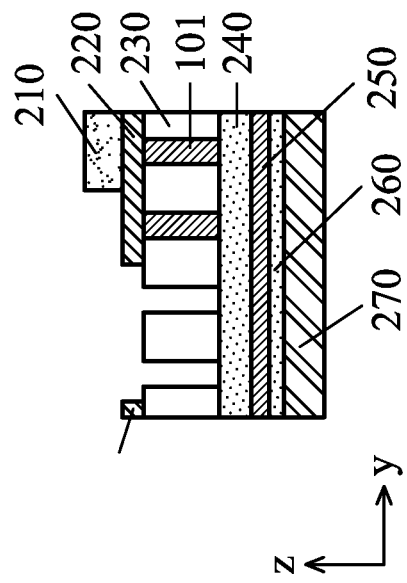
Figure 7F:
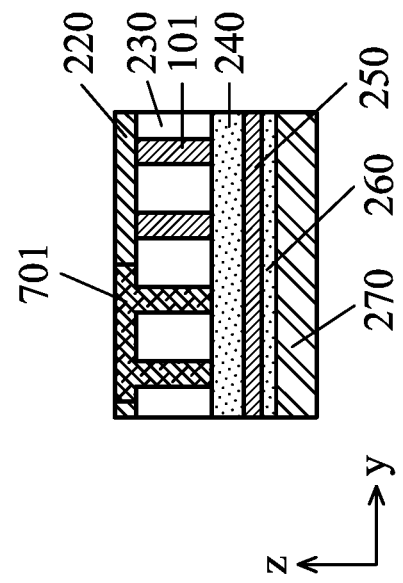

In various embodiments, the method for reducing corner rounding further includes, prior to etching the substrate, removing a portion of the first mask layer 220 using the second pattern 222 (illustrated in FIGS. 7C and 7D), forming a second mask layer (illustrated in FIGS. 7E and 7F), forming a third pattern 712 in the second mask layer (illustrated in FIG. 7I or 7J), and removing the second mask layer 210. In an embodiment, the first mask 220 is etched using the third pattern before removing the second mask layer 210 as illustrated in FIGS. 7K and 7L. In such embodiments, the line patterns 101 are also removed prior to removing the second mask layer 210 as shown in FIGS. 7M and 7N. A pattern according to an embodiment is obtained following the removal of the second mask layer 210 as illustrated in FIGS. 7O and 7P.

Figure 7G:
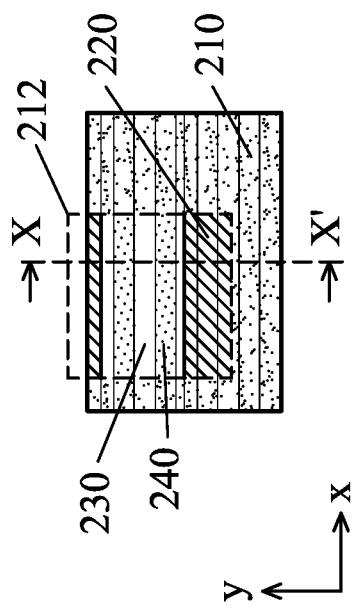
Figure 7H:
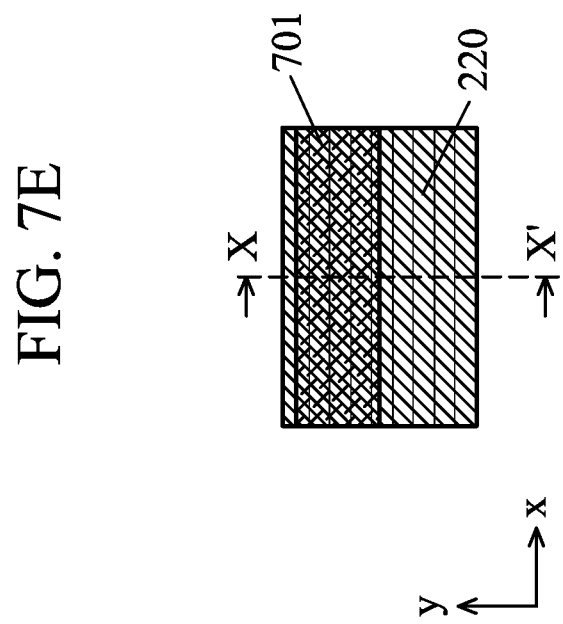

In some embodiments, the method further includes, prior to forming the second pattern, etching one or more materials of the portion of substrate exposed by the first pattern (illustrated in FIGS. 7C-7F), and filling the etched portion of the substrate exposed by the first pattern with a filler material 701 different from the material that was etched (as illustrated in FIGS. 7G and 7H). In other embodiments, the method further includes, prior to etching the substrate, removing a portion of the first mask layer using the second pattern (illustrated in FIGS. 8G and 8H), removing the entirety of the second mask layer (illustrated in FIGS. 8G-8J), forming a third mask layer 810, forming a third pattern 812 in the third mask layer 810 (illustrated in FIGS. 8K and 8L), and removing the third mask layer 810. The third pattern 712 or 812 is formed such that at least a portion of the third pattern 712 or 812 overlaps the first pattern so that at least one of the first edges (defined by the first pattern) intersects with at least one edge of the third pattern 712 or 812 to form a second corner (e.g., an in-corner) of the prescribed pattern. In various embodiments, the material used for filling the etched portion of the substrate has etch selectivity with respect to silicon dioxide as well as silicon nitride. For example, in an embodiment, the material used for filling the etched portion of the substrate is titanium nitride.

Figure 7I:
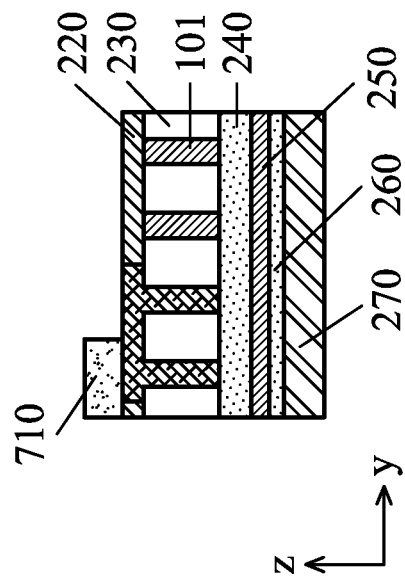
Figure 7J:
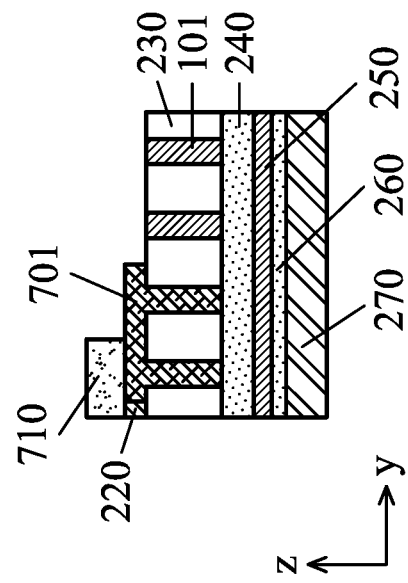
Figure 7K:
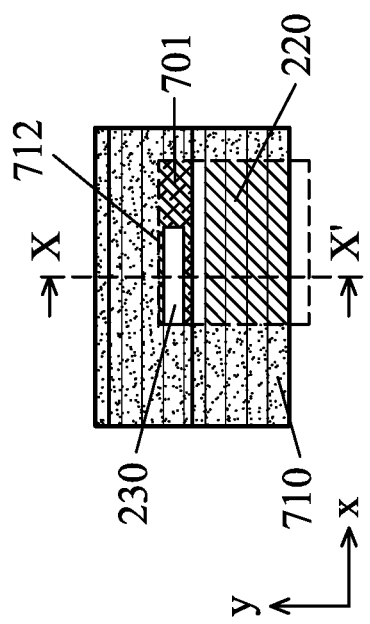
Figure 7L:
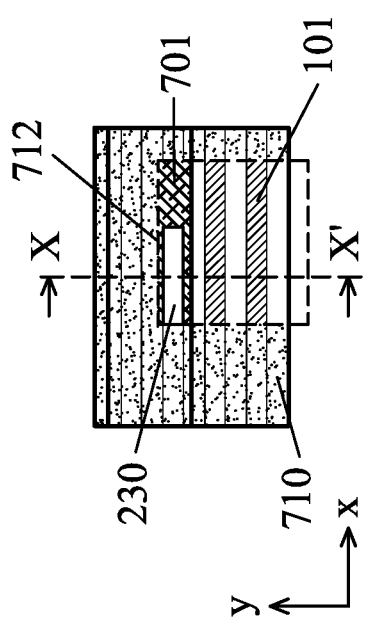
Figure 7M:
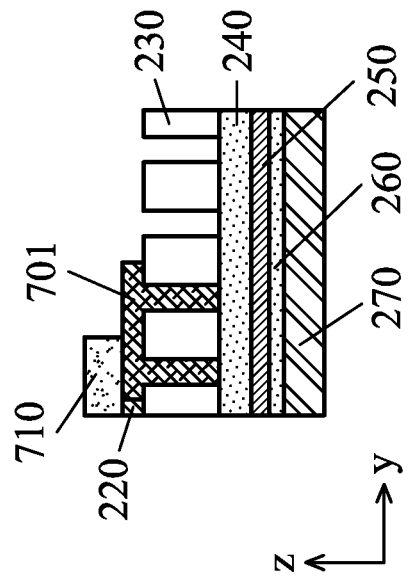
Figure 7N:
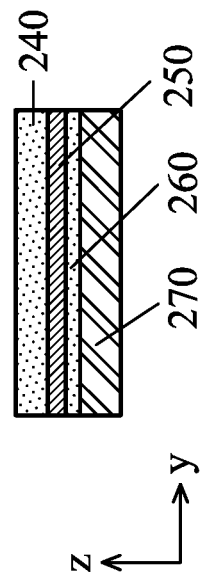
Figure 7O:
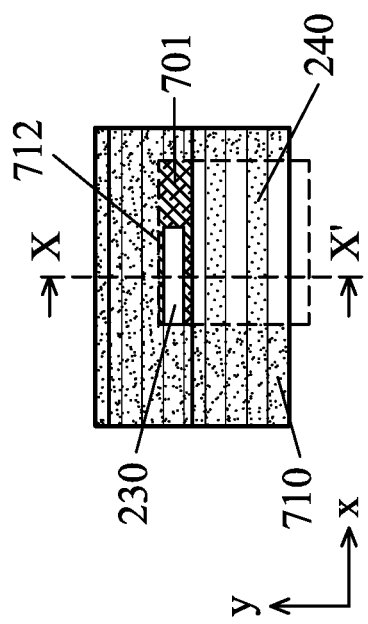
Figure 7P:
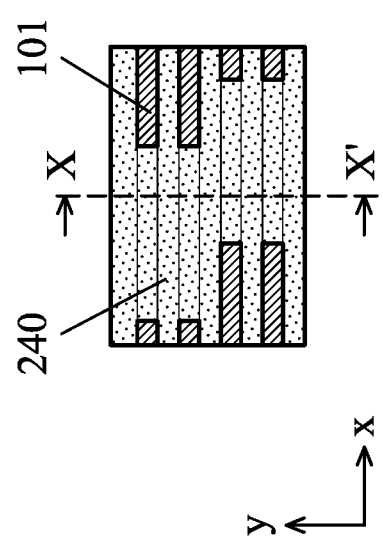

More specifically, as shown in FIGS. 7A and 7B, a first mask layer 220 is formed over the substrate including line patterns 101. Then, by using one or more lithography and etching operations, a first mask pattern 222 (an opening) is formed in the first mask pattern. The first mask pattern 222 exposes part of the line patterns 101, as shown in FIGS. 7C and 7D. Then, a second mask layer 210 is formed over the structure of FIGS. 7C and 7D, and by using one or more lithography and etching operations, a second mask pattern 212 (an opening) is formed, and further through the second mask pattern 212, the line patterns 101 are removed, as shown in FIGS. 7E and 7F. Here, the second mask pattern 212 partially exposes the first mask layer 220, and the exposed first mask layer 220 is not etched when the line patterns 101 are removed. Then, a first filler material 701, for example, titanium nitride, is formed to fill the space from which the line patterns 101 are removed, as shown in FIGS. 7G and 7H. In some embodiments, a CMP operation in performed to remove the excess filling material and the second mask layer. Further, a third mask layer 710 is formed and by using one or more lithography and etching operations, a third mask pattern 712 (an opening) is formed to expose a part of the filled pattern and the first mask layer as shown in FIGS. 7I and 7J. By using the third mask pattern 712 as an etching mask, the first mask layer is etched as shown in FIGS. 7K and 7L. Subsequently, as shown in FIGS. 7M and 7N, the line patterns 101 are removed and then the first, second and third mask layers 220, 210, and 710 and filled patterns are removed to obtain the structure as shown in FIGS. 7O and 7P. As with other embodiments disclosed herein, the particular materials and processes used for forming various features are dependent on compatibility with preexisting materials on substrate 280 as well as the etch selectivity required based on subsequent processes. For example, in the embodiment disclosed with respect to FIGS. 7A-7P, the materials for the first mask layer 220 and the second mask layer 210 should have etch selectivity with respect to each other. Thus, for example, when one of them is silicon dioxide, the other is silicon nitride. On the other hand, the first filler 701 need not have etch selectivity with respect to spacer 230 for the prescribed pattern in the embodiment disclosed with respect to FIGS. 7A-77P. Thus, the first filler material 701 and spacer 230 are the same in some embodiments. In other embodiments, if a particular pattern requires, the first filler material 701 and spacer 230 have different materials with etch selectivity for a particular etchant.

Figure 8B:
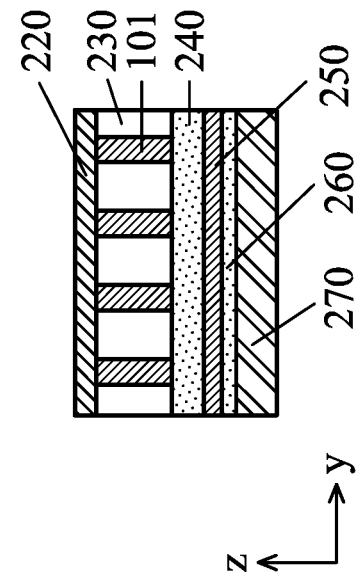
Figure 8D:
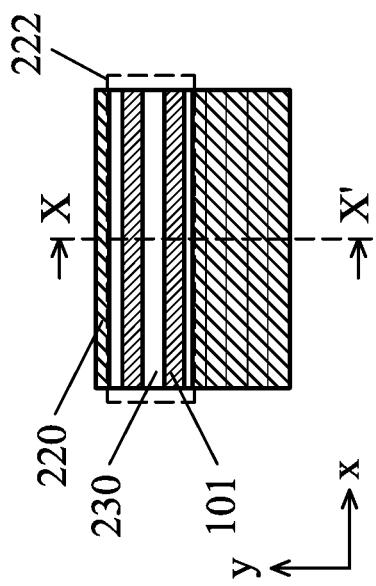
Figure 8A:
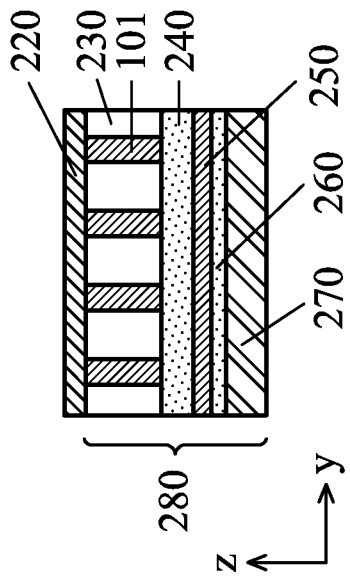
FIGS. 8A-8T schematically illustrate various stages of formation of a pattern with overlapping rectangles using another patterning method in accordance with an embodiment of the present disclosure.
Figure 8C:
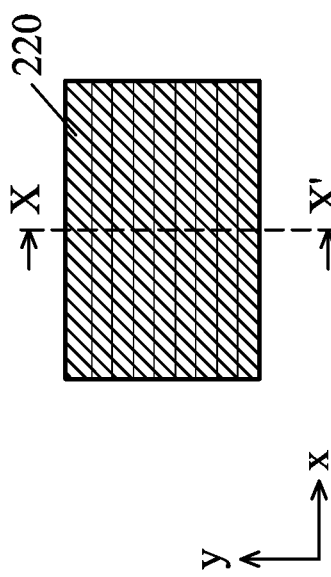
Figure 8E:
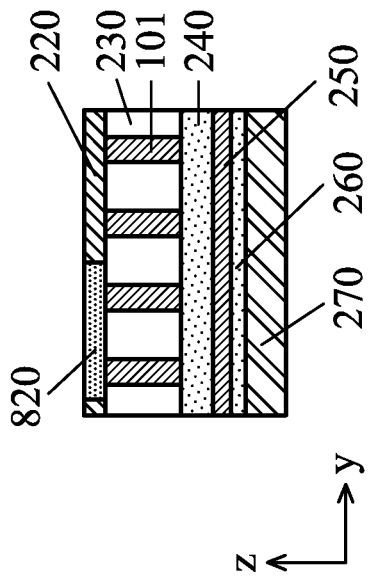
Figure 8F:
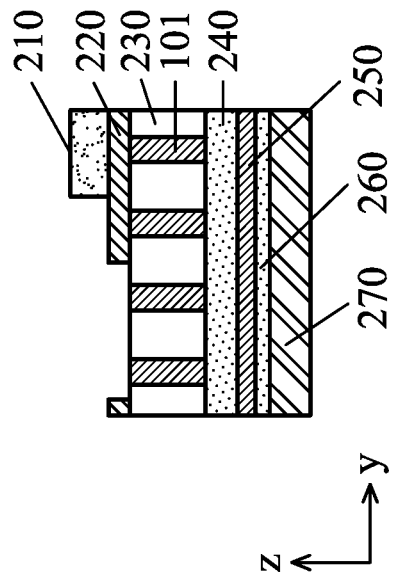
Figure 8G:
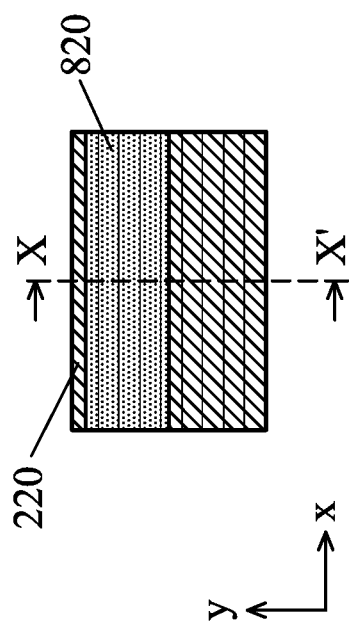
Figure 8H:
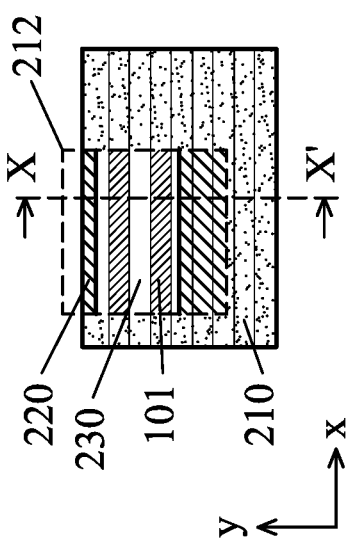
Figure 8I:
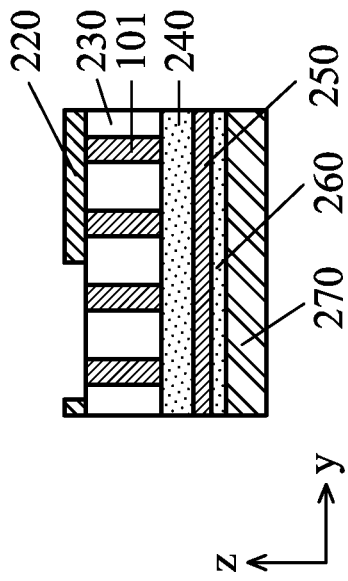
Figure 8J:
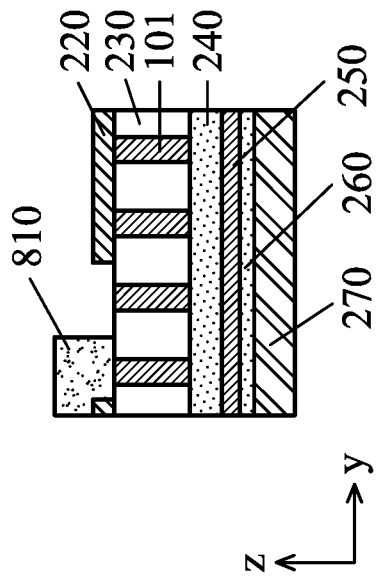
Figure 8K:
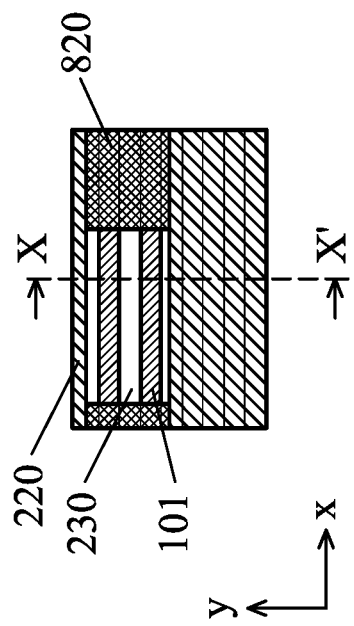
Figure 8L:
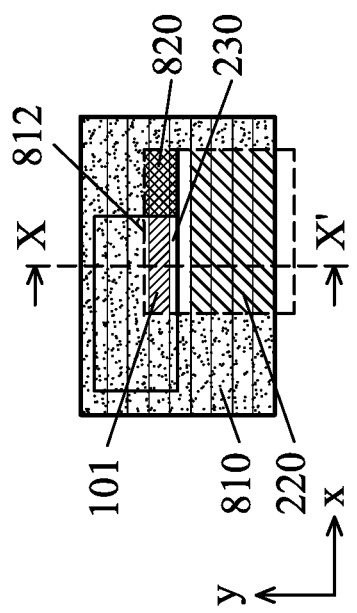
Figure 8M:
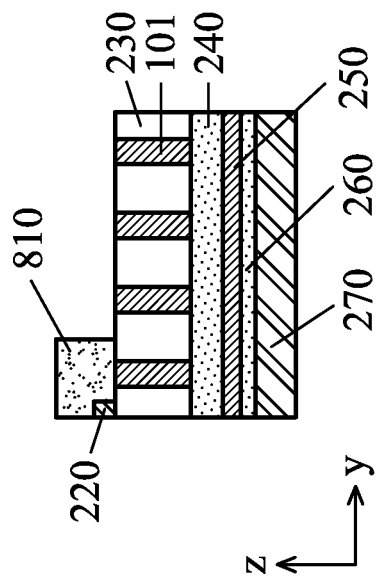
Figure 8N:
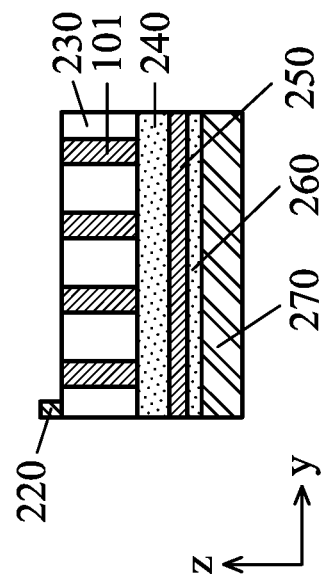
Figure 8O:
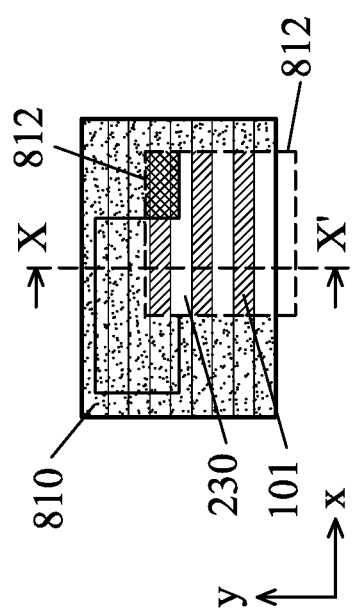
Figure 8P:
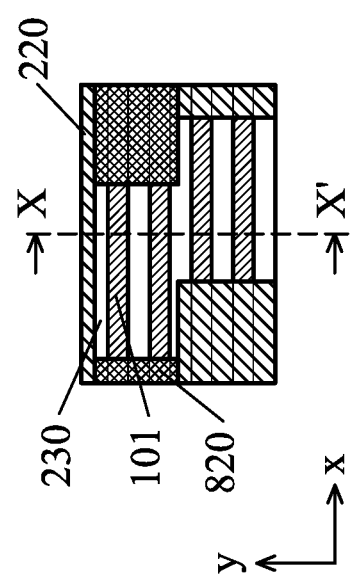
Figure 8Q:
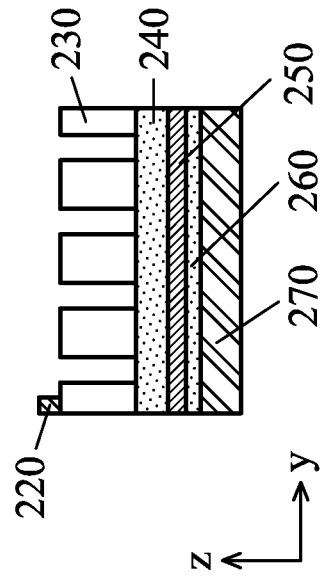
Figure 8R:
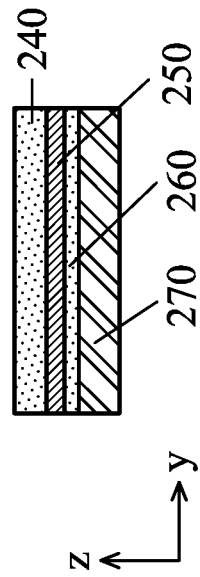
Figure 8S:
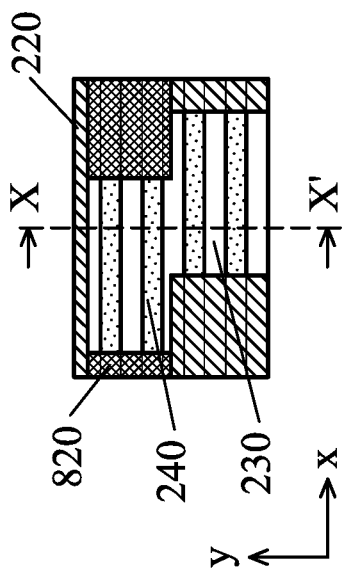
Figure 8T:
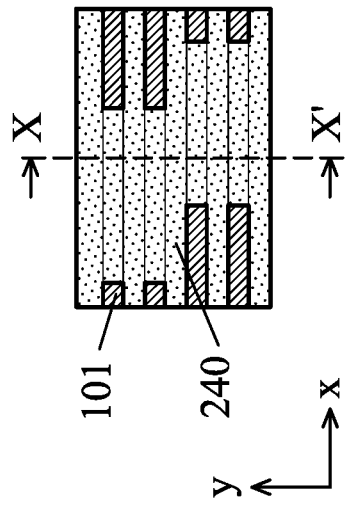

In an embodiment, following forming the first pattern 222, the first mask layer 220 is removed using the first pattern 222 as illustrated in FIGS. 8C and 8D. A mask filler material 820 is then deposited in the portion of first mask layer 220 where the substrate 280 is exposed as illustrated in FIGS. 8E and 8F. The mask filler material 820, in various embodiments, is selected to be one having etch selectivity with respect to the material of the second mask layer 210. For example, in an embodiment, while the material for the second mask layer 210 is silicon dioxide, the mask filler material 820 is titanium nitride. In various embodiments, a second mask layer 210 is formed on the first mask layer 220 and the mask filler material 820 as illustrated in FIGS. 8G and 8H. A second pattern 212 is then formed over the second mask layer 210. The mask filler material 820 is then removed through the second pattern 212 as depicted in FIGS. 8I and 8J. Following this, a third mask layer 810 is formed and a third pattern 812 is formed over the third mask layer 810 as shown in FIGS. 8K and 8L. The mask filler material 820 and the first mask layer 220 exposed through the third pattern 812 are then removed as illustrated in FIGS. 8M and 8N. Next, the third mask layer 810 is removed to reveal the prescribed pattern as depicted in FIGS. 8O-8R. The line structures 101 are then etched through to form the prescribed pattern over the substrate 280 as shown in FIGS. 8S and 8T.

More specifically, as shown in FIGS. 8A and 8B, a first mask layer 220 is formed over the substrate including line patterns 101. Then, by using one or more lithography and etching operations, a first mask pattern 222 (an opening) is formed in the first mask pattern. The first mask pattern 222 exposes part of the line patterns 101, as shown in FIGS. 88C and 8D. Then, a mask filler material 820 is used to fill the opening of the first mask pattern 222 as shown in FIGS. 8E and 8F. A CMP is subsequently performed in some embodiments. Then, a second mask layer 210 is formed over the structure as shown in FIGS. 8G and 8H, and by using one or more lithography and etching operations, a second mask pattern 212 (an opening) is formed, and further through the second mask pattern 212, the mask filler material 820 is removed, as shown in FIGS. 8G and 8H. Here, the second mask pattern 212 partially exposes the first mask layer 220. Then, as shown in FIGS. 8I and 8J, the second mask layer 210 is removed. Next, a third mask layer 810 is formed and by using one or more lithography and etching operations, a third mask pattern 812 (an opening) is formed to expose a part of the first mask layer 220 and the substrate as shown in FIGS. 8K and 8L. By using the third mask pattern 812 as an etching mask, the mask material 812 is removed as shown in FIGS. 8M and 8N. Then, the third mask layer 810 is removed as shown in FIGS. 88O and 8P. Next, by using the first mask layer 220 and mask filler material 820 as an etching mask, the line patterns 101 are removed as shown in FIGS. 8Q and 8R. Subsequently, the first mask layer 220 and the mask filler material 820 are removed to obtain the structure as shown in FIGS. 8S and 8T. As with other embodiments disclosed herein, the particular materials and processes used for forming various features are dependent on compatibility with preexisting materials on substrate 280 as well as the etch selectivity required based on subsequent processes. For example, in the embodiment disclosed with respect to FIGS. 8A-8T, the materials for the first mask layer 220 and the second mask layer 210 have etch selectivity with respect to each other in some embodiments. Thus, for example, when one of them is silicon dioxide, the other is silicon nitride. Likewise, the mask filler material 820 has etch selectivity with respect to materials of the first mask layer 220 and the second mask layer 210 for the prescribed pattern in the embodiment disclosed with respect to FIGS. 8A-8T. Thus, the material for the second mask material 820 is titanium nitride in some embodiments. In other embodiments, if a particular pattern requires, the second mask material 820 and material of either of the first mask layer 220 or the second mask layer 210 are the same material so as to not be selective for a particular etchant.

Those of ordinary skill in the art will appreciate that using the methods disclosed herein, rounding of corners for various patterns can be avoided, thereby improving pattern fidelity during lithography. It will be understood that while the methods in the present disclosure are defined with respect to photolithography, the same methods are applicable to other types of lithography techniques such as, for example, electron beam lithography or ion beam lithography.

It will be understood that not all advantages have been necessarily discussed herein, no particular advantage is required for all embodiments or examples, and other embodiments or examples may offer different advantages.

According to an aspect of the present disclosure, a method of patterning includes forming a first mask layer on a substrate to be provided with a prescribed pattern having one or more first edges in a first direction and one or more second edges in a second direction. The second direction is arranged at a non-zero angle to the first direction. The method further includes forming a first pattern over the first mask layer and removing the first mask layer using the first pattern to form the one or more first edges of the prescribed pattern on the substrate to form a first patterned mask. The method further includes forming a second mask layer on the first mask layer, forming a second pattern over the second mask layer. The method further includes removing the second mask layer using the second pattern to form the one or more second edges of the prescribed pattern on the substrate to form the second patterned mask over the substrate to expose portions of the substrate. At least a portion of the second pattern overlaps the first pattern such that at least one of the first edges intersects with at least one of the second edges to form a first corner of the prescribed pattern. The method further includes etching the substrate through the first pattern and the second pattern to form the prescribed pattern in the substrate. In one or more of the foregoing and following embodiments, the first direction is orthogonal to the second direction. In an embodiment, the method further includes, prior to the etching the substrate, removing a portion of the first mask layer using the second pattern, removing the entirety of the second mask layer, forming a third mask layer, forming a third pattern over the third mask layer, and removing the third mask layer using the third pattern. At least a portion of the third pattern overlaps the first pattern such that at least one of the first edges intersects with at least one edge of the third pattern to form a second corner of the prescribed pattern. In some embodiments, the first mask layer has a material selected from silicon nitride and silicon dioxide. In some embodiments, the method further includes, prior to forming the second pattern, filling the first pattern with a first filler having a different etch selectivity from a material of the first mask layer. In an embodiment, a material of the first filler is titanium nitride. In some embodiments, the substrate comprises two or more materials, disposed in a pattern, in a portion exposed by the first pattern. In an embodiment, the method further includes, prior to forming the second pattern, etching a first of the two or more materials of the portion of the substrate exposed by the first pattern. In an embodiment, the method further includes, prior to forming the second pattern, filling the etched portion of the substrate exposed by the first pattern with a second material different from the first material. In some embodiments, the first corner is an out-corner.

According to another aspect of the present disclosure, a prescribed pattern has one or more first edges in a first direction and one or more second edges in a second direction. The first edges and the second edges form corners of the prescribed pattern. A method of patterning to obtain the prescribed pattern in a substrate includes dividing the prescribed pattern into a first pattern forming one or more of the first edges and a second pattern forming one or more of the second edges. The method further includes forming a first mask layer over the substrate, forming a second mask layer over the first mask layer, and forming the second pattern in the second mask layer. The method further includes removing a portion of the second mask layer using the second pattern and forming the first pattern over the first mask layer. At least a portion of the second pattern overlaps the first pattern to form the corners of the prescribed pattern. The method further includes, removing a portion of the first mask layer exposed through the second mask layer to expose a portion of the substrate, and etching the substrate exposed through the first mask layer and the second mask layer to obtain the prescribed pattern. In one or more of the foregoing and following embodiments, the method further includes, prior to forming the second pattern, etching a first of the two or more materials of the portion of the substrate exposed by the first pattern. In an embodiment, the method further includes, prior to forming the second pattern, filling the etched portion of the substrate exposed by the first pattern with a second material different from the first material. In an embodiment, the second material is the same as a material of the substrate. In some embodiments, the first direction is orthogonal to the second direction. In some embodiments, the first mask layer has a material selected from silicon nitride and silicon dioxide. In an embodiment, the method further includes, prior to forming the second pattern, filling the first pattern with a first filler having a different etch selectivity from a material of the first mask layer.

According to yet another aspect of the present disclosure, a method of reducing corner rounding during patterning of a substrate to form a prescribed pattern having a corner includes dividing the pattern into a first pattern and a second pattern. The first pattern forms a first edge of the corner and the second pattern forms a second edge of the corner. At least a portion of the second pattern overlaps the first pattern such that the first edge intersects with the second edge to form a corner of the prescribed pattern. The method further includes forming the first pattern in a first mask layer disposed over a substrate to expose the substrate, forming the second pattern in the first mask layer to expose the substrate, and etching the substrate exposed through the first mask layer to obtain the prescribed pattern. In one or more of the foregoing and following embodiments, the substrate includes two or more materials, disposed in a preexisting pattern, in a portion exposed by the first pattern, and the method further includes, prior to forming the second pattern, etching a first of the two or more materials of the portion of the substrate exposed by the first pattern. In an embodiment, the method further includes, prior to the etching the substrate, removing a portion of the first mask layer using the second pattern, forming a second mask layer, forming a third pattern in the second mask layer, and removing the second mask layer using the third pattern. At least a portion of the third pattern overlaps the first pattern such that at least edge of the first pattern intersects with at least one edge of the third pattern to form a second corner of the prescribed pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning, the method comprising:
   forming a first mask layer on a substrate having two or more materials to be provided with a prescribed pattern having one or more first edges in a first direction and one or more second edges in a second direction, the second direction being arranged at a non-zero angle to the first direction;
   forming a first pattern over the first mask layer;
   removing a portion of the first mask layer using the first pattern to form the one or more first edges of the prescribed pattern on the substrate to form a first patterned mask;
   forming a second mask layer on the first mask layer;
   forming a second pattern over the second mask layer;
   removing a portion of the second mask layer using the second pattern to form the one or more second edges of the prescribed pattern on the substrate to form a second patterned mask over the substrate to expose portions of the substrate, wherein at least a portion of the second pattern overlaps the first pattern such that at least one of the first edges intersects with at least one of the second edges to form a first corner of the prescribed pattern;
   prior to forming the second pattern, etching a first of the two or more materials of the portion of the substrate exposed by the first pattern; and
   etching the substrate exposed through the first patterned mask and etching the substrate exposed through the second patterned mask to form the prescribed pattern in the substrate.

2. The method of claim 1, wherein the first direction is orthogonal to the second direction.

3. The method of claim 1, wherein the first mask layer has a material selected from silicon nitride and silicon dioxide.

4. The method of claim 1, further comprising, prior to forming the second pattern, filling the first pattern with a first filler having a different etch selectivity from a material of the first mask layer.

5. The method of claim 4, wherein a material of the first filler is titanium nitride.

6. The method of claim 1, further comprising, prior to forming the second pattern, filling the etched portion of the substrate exposed by the first pattern with a second material different from the first material.

7. The method of claim 1, wherein the first corner is an out-corner.

8. A method of patterning, the method comprising:
   forming a first mask layer on a substrate;
   forming a first pattern over the first mask layer;
   removing a portion of the first mask layer using the first pattern to form first edges of a prescribed pattern on the substrate;
   forming a second mask layer on the first mask layer;
   forming a second pattern over the second mask layer;
   prior to forming the second pattern, etching a portion of the substrate comprising a first material exposed by the first pattern to form an etched portion of the substrate;
   removing a portion of the second mask layer using the second pattern to form one or more second edges of the prescribed pattern on the substrate to form a second patterned mask over the substrate to expose portions of the substrate; and
   etching the substrate exposed through a first patterned mask and etching the substrate through the second patterned mask to form the prescribed pattern in the substrate.

9. The method of claim 8, wherein the first edges extend in a first direction, and the second edges extend in a second direction, wherein the first direction is orthogonal to the second direction.

10. The method of claim 8, further comprising, prior to forming the second pattern, filling the first pattern with a first filler having a different etch selectivity from a material of the first mask layer.

11. The method of claim 8, further comprising, filling the etched portion of the substrate exposed by the first pattern with a second material different from the first material.

12. The method of claim 8, wherein the first pattern and second pattern are formed in a first photoresist layer and a second photoresist layer, respectively.

13. The method of claim 8, wherein the first mask and the second mask have different etch selectivities.

14. The method of claim 10, wherein a material of the first filler is titanium nitride.

15. A method of patterning, the method comprising:
   forming a first mask layer on a substrate having two or more materials to be provided with a prescribed pattern having one or more first edges in a first direction and one or more second edges in a second direction, the second direction being arranged at a non-zero angle to the first direction;
   forming a first pattern over the first mask layer;
   removing a portion of the first mask layer using the first pattern to form the one or more first edges of the prescribed pattern on the substrate to form a first patterned mask;
   forming a second mask layer on the first mask layer;
   forming a second pattern over the second mask layer;
   removing a portion of the second mask layer using the second pattern to form the one or more second edges of the prescribed pattern on the substrate to form a second patterned mask over the substrate exposing portions of the substrate, wherein at least a portion of the second pattern overlaps the first pattern such that at least one of the first edges intersects with at least one of the second edges to form a first corner of the prescribed pattern;

prior to forming the second pattern, filling the first pattern with a first filler having a different etch selectivity from a material of the first mask layer, wherein a material of the first filler is titanium nitride; and etching the substrate exposed through the first patterned mask and etching the substrate exposed through the second patterned mask to form the prescribed pattern in the substrate.

16. The method of claim 15, wherein the first direction is orthogonal to the second direction.

17. The method of claim 15, wherein the first pattern is formed in a first photoresist layer.

18. The method of claim 15, wherein the second pattern is formed in a second photoresist layer.

19. The method of claim 15, wherein the first mask and the second mask have different etch selectivities.

\* \* \* \* \*